United States Patent
Keller et al.

(10) Patent No.: US 10,546,732 B2
(45) Date of Patent: Jan. 28, 2020

(54) SPUTTER DEPOSITION SOURCE, APPARATUS FOR SPUTTER DEPOSITION AND METHOD OF ASSEMBLING THEREOF

(71) Applicant: Applied Materials, Inc., Santa Clara, CA (US)

(72) Inventors: Stefan Keller, Mainaschaff (DE); Uwe Schüßler, Aschaffenburg (DE); Dieter Haas, San Jose, CA (US); Stefan Bangert, Steinau (DE)

(73) Assignee: Applied Materials, Inc., Santa Clara, CA (US)

( * ) Notice: Subject to any disclaimer, the term of this patent is extended or adjusted under 35 U.S.C. 154(b) by 36 days.

(21) Appl. No.: 15/033,868

(22) PCT Filed: Nov. 5, 2013

(86) PCT No.: PCT/EP2013/073038
§ 371 (c)(1),
(2) Date: May 2, 2016

(87) PCT Pub. No.: WO2015/067298
PCT Pub. Date: May 14, 2015

(65) Prior Publication Data
US 2016/0268109 A1  Sep. 15, 2016

(51) Int. Cl.
*H01J 37/34* (2006.01)
*C23C 14/35* (2006.01)
*H01J 37/32* (2006.01)

(52) U.S. Cl.
CPC .......... *H01J 37/3408* (2013.01); *C23C 14/35* (2013.01); *H01J 37/32183* (2013.01);
(Continued)

(58) Field of Classification Search
CPC ............ H01J 37/3408; H01J 37/32183; H01J 37/32577; H01J 37/3444; H01J 37/3455; C23C 14/35
See application file for complete search history.

(56) References Cited

U.S. PATENT DOCUMENTS 3,652,443 A * 3/1972 Fish .................. C10M 3/00
                                            204/192.12
4,450,062 A * 5/1984 Macaulay ............. C23C 14/564
                                            204/192.3
(Continued)

FOREIGN PATENT DOCUMENTS

| CN | 102439697 A | 5/2012 |
| TW | 201104004 A | 2/2011 |

(Continued)

OTHER PUBLICATIONS

In the matter of the application of Percy St. George Kirke, 5 USPQ 539.*

(Continued)

*Primary Examiner* — John J Brayton
(74) *Attorney, Agent, or Firm* — Patterson + Sheridan, LLP

(57) ABSTRACT

A sputter deposition source for sputter deposition in a vacuum chamber is described. The source includes a wall portion of the vacuum chamber; a target providing a material to be deposited during the sputter deposition; an RF power supply for providing RF power to the target; a power connector for connecting the target with the RF power supply; and a conductor rod extending through the wall portion from inside of the vacuum chamber to outside of the vacuum chamber, wherein the conductor rod is connected to one or more components inside of the vacuum chamber and wherein the conductor rod is connected to the RF power (Continued)

supply outside of the vacuum chamber to generate a defined RF return path through the conductor rod.

18 Claims, 5 Drawing Sheets

(52) U.S. Cl.
CPC .... *H01J 37/32577* (2013.01); *H01J 37/3444* (2013.01); *H01J 37/3455* (2013.01)

(56) References Cited

U.S. PATENT DOCUMENTS

| | | | | |
|---|---|---|---|---|
| 4,587,851 A | * | 5/1986 | Mortberg | G01L 9/0072 361/283.4 |
| 2010/0252417 A1 | * | 10/2010 | Allen | C23C 14/345 204/192.12 |
| 2011/0240464 A1 | | 10/2011 | Rasheed et al. | |

FOREIGN PATENT DOCUMENTS

| | | |
|---|---|---|
| TW | 201142068 A | 12/2011 |
| WO | 2002010471 | 2/2002 |
| WO | 2008057105 | 5/2008 |

OTHER PUBLICATIONS

Office Acton for Chinese Patent Application No. 201380080736.8 dated Mar. 28, 2017.
International Search Report and Written Opinion dated Jul. 21, 2014 for Application No. PCT/EP2013/073038.
TW Search Report of Patent Application No. 103138000 dated Jul. 17, 2018.
TW Office Action English Translation Application No. 103138000 dated Nov. 29, 2018, consists of 4 pages.

* cited by examiner

SPUTTER DEPOSITION SOURCE, APPARATUS FOR SPUTTER DEPOSITION AND METHOD OF ASSEMBLING THEREOF

TECHNICAL FIELD OF THE INVENTION

Embodiments of the present invention relate to a sputter cathode and methods of operating and manufacturing thereof. Embodiments relate to an apparatus for deposition in a vacuum chamber. Embodiments of the present invention specifically to a sputter deposition source for sputter deposition in a vacuum chamber, an apparatus for sputter deposition in a vacuum chamber and a method of assembling an apparatus for sputter deposition in a vacuum chamber.

BACKGROUND OF THE INVENTION

PVD processes gain increasing attention in some technical fields, e.g. display manufacturing. A good deposition rate can be obtained with sufficient layer characteristics for some PVD processes. For example, sputtering is one important deposition process for display manufacturing or other applications. Sputtering, e.g. magnetron sputtering is a technique for coating substrates, e.g. glass or plastic substrates. Sputtering generates a stream of coating material by sputtering a target through the use of a plasma. During this a process in which material is released from the surface of the target by collision with high-energy particles from the plasma. Sputtering is controllable by plasma parameters, such as pressure, power, gas, and a magnetic field. In vacuum, the sputtered materials travel from the target toward one or more substrates or workpieces and adhere to the surface thereof. A wide variety of materials, including metals, semiconductors and dielectric materials can be sputtered to desired specifications. Magnetron sputtering has thus found acceptance in a variety of applications including semiconductor processing, optical coatings, food packaging, magnetic recording, and protective wear coatings.

Magnetron sputtering devices include a power supply for depositing energy into a gas to strike and maintain a plasma, magnetic elements for controlling the motion of ions, and targets for generating coating material through sputtering by the plasma. Sputtering is accomplished with a wide variety of devices having differing electrical, magnetic, and mechanical configurations. The configurations include sources of DC or AC electromagnetic fields or radio frequency energy to produce the plasma. Particularly, non-conductive materials may be sputtered using RF sputtering methods.

RF-PVD is desired for a plurality of application, e.g. sputtering of non-conductive materials. However, an RF-sputtering process often generates arcing and parasitic plasma. Attempts have been taken to solve these issues with enormous individual efforts during assembly and commissioning of the apparatuses and systems for RF sputtering.

SUMMARY OF THE INVENTION

In light of the above, a sputter deposition source for sputter deposition in a vacuum chamber according to independent claim 1, an apparatus for sputter deposition in a vacuum chamber according to claim 12 and a method of assembling an apparatus for sputter deposition in a vacuum chamber according to independent claim 14 are provided. Further aspects, advantages, and features of the present invention are apparent from the dependent claims, the description, and the accompanying drawings.

According to one embodiment, a sputter deposition source for sputter deposition in a vacuum chamber is provided. The source includes a wall portion of the vacuum chamber; a target providing a material to be deposited during the sputter deposition; an RF power supply for providing RF power to the target; a power connector for connecting the target with the RF power supply; and a conductor rod extending through the wall portion from inside of the vacuum chamber to outside of the vacuum chamber, wherein the conductor rod is connected to one or more components inside of the vacuum chamber and wherein the conductor rod is connected to the RF power supply outside of the vacuum chamber to generate a defined RF return path through the conductor rod.

According to another embodiment, an apparatus for sputter deposition in a vacuum chamber is provided. The apparatus includes a sputter deposition source for sputter deposition in the vacuum chamber; and the vacuum chamber. The source includes a wall portion of the vacuum chamber; a target providing a material to be deposited during the sputter deposition; an RF power supply for providing RF power to the target; a power connector for connecting the target with the RF power supply; and a conductor rod extending through the wall portion from inside of the vacuum chamber to outside of the vacuum chamber, wherein the conductor rod is connected to one or more components inside of the vacuum chamber and wherein the conductor rod is connected to the RF power supply outside of the vacuum chamber to generate a defined RF return path through the conductor rod.

According to a further embodiment, a method of assembling an apparatus for sputter deposition in a vacuum chamber is provided. The method includes insert a conductor rod through a wall portion of the apparatus; connecting at least one component inside of the vacuum chamber to the conductor rod; and connecting the conductor rod to the return path of an RF power supply.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF EMBODIMENTS

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

When referring to RF power, RF power supplies, and RF currents herein, it is sometimes referred to the "hot path" and the "return path", respectively. Thereby, the return path is comparable to the neutral conductor in an AC network. The hot path is comparable to the conductor driving the power in an AC network.

Figure 1:
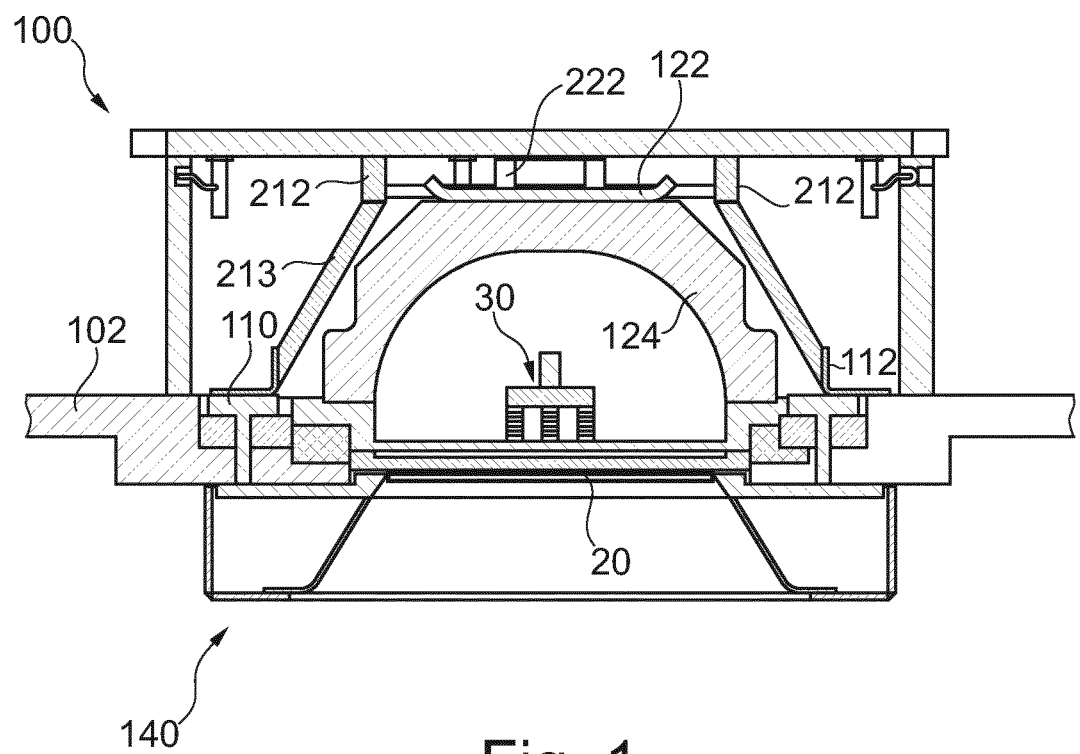
FIG. 1 shows a schematic view of a sputter deposition source having a defined RF return path according to embodiments described herein.

FIG. 1 shows a sputter deposition source 100 for sputter deposition in a vacuum chamber. The sputter deposition source includes a wall portion 102 of a vacuum chamber of a deposition apparatus. According to some embodiments, the wall portion 102 can be a portion of the entire vacuum chamber. According to other embodiments, the wall portion of the vacuum chamber can be a door of the sputter deposition source 100, which is provided in the vacuum chamber, wherein the door forms a part of the vacuum chamber. Accordingly, the door can also be a wall portion of the vacuum chamber.

The sputter deposition source 100 includes a target 20. As exemplarily shown in FIG. 1, a sputter deposition source can typically also include a magnetron. A magnetron is a magnet assembly, typically provided by permanent magnets, in order to confine the plasma during sputter deposition. According to typical embodiments, which can be combined with other embodiments described herein, the magnetron 30 can be moved in at least one direction over the surface of the target 20. Thereby, the race track on the target can be beneficially influenced, for example in order to increase the amount of target material that can be used before the target 20 needs to be exchanged.

Many applications, for example sputtering of non-conductive materials or sputtering of materials of a high resistivity (e.g. $10^6$ Ohm cm), can be conducted with RF sputtering. Thereby, RF sputtering provides a high sputter rate. However, for RF sputtering it is difficult to provide the power to the target. Generally, an RF power supply is connected to a matchbox. The matchbox adapts the internal resistance of the power supply to the load impedance of the plasma.

The "hot" conductor of the RF power supply is connected to the target. In common RF sputter deposition sources the return-path of the RF power is provided by components of the vacuum chamber or components, e.g. holders, of the source, i.e. the return-path to the matchbox is undefined. Since the depths of penetration of RF currents in conductors is slow (skin-effect) the current flows along the surface and is, for example, hindered by notches, electrical connections between two parts, and other mechanical portions of the vacuum deposition source and/or the vacuum chamber. This can lead to uncontrolled local discharge within the chamber and parts implemented in the apparatus for sputter deposition. Such arts can be, for example, a carrier, targets, the substrate, etc. The local discharge can result in arcing, for example hard arcs or μarcs, as well as parasitic plasmas.

According to embodiments described herein, a defined return path for RF currents is provided. The defined return-path for the RF currents reduces or even solves one or more of the above problems. Accordingly, improved stability of the deposition conditions, better layer quality, reduced or even no target damaging, and/or reduced arcing or even no arcing can be provided due to embodiments described herein. According to some embodiments, which can be combined with other embodiments describe herein, RF frequencies are can be in the range between 5 and 30 MHz, typically 13.56 MHz.

As shown in FIG. 1 the "hot" RF path for providing the RF power from the power supply, typically via the matchbox, is provided by the junction bridge 122 and several connectors 124. Typically, the connectors are connected (e.g. symmetrical) to a backing plate of the target for providing RF power to the target 20. The matchbox power connector is provided by a hot path sheet-metal 222. For example, the hot path sheet-metal is screwed to the junction bridge 122 upon assembling of the deposition source and/or the apparatus for sputter deposition.

According to embodiments described herein, the return-path is provided by one or more conductor rods 110. According to yet further implementations, the conductor rods can be connected to a return-path RF power collection sheet-metal 112. According to yet further implementations, which can be combined with other embodiments described herein, the return-path RF power collection sheet-metal 112 can be provided to a power supply sheet-metals 213 and 212 in order to provide at return path for the RF currents to the matchbox and/or the power supply.

According to embodiments described herein, one or more sheet metals are provided, for example a hot path sheet-metal, a return-path RF power collection sheet-metal, a power supply sheet-metal and other sheet-metals for guiding the RF power to the target 20 and from the target 20 to the matchbox and the power supply, respectively. Typically, those sheet-metals can be made of a material selected from the group consisting of: silver, copper, aluminum, gold, or combinations thereof. According to yet further embodiments, which can be combined with other embodiments described herein, the sheet-metals can have the thickness of at least 0.1 mm, typically 1 mm to 5 mm and/or can have a width of 10 mm or above, typically 20 mm to 70 mm. Thereby, RF currents having a small depths of penetration in a conductor due to the skin-effect, can be beneficially guided from the power supply or the matchbox, respectively and to the matchbox or the power supply, respectively.

According to yet further embodiments, which can be combined with other embodiments described herein, the sheet metals described herein can be coated, e.g. with copper or silver or gold. As the current does not penetrate the conductor deeply, a good conductivity at the surface is desired. For example, the sheet metals can also include stainless steel and are coated with a silver layer or a copper layer. Thereby, aspects like costs and material strength can also be considered.

According to yet further embodiments, in addition or alternatively to the width and/or the thickness of the sheet metals, the size of the surface area can be considered. For example, the size of the surface per unit length can be 22 mm$^2$/mm, i.e. 22 mm$^2$ per 1 millimeter length of the sheet metals, or above.

Figure 2:
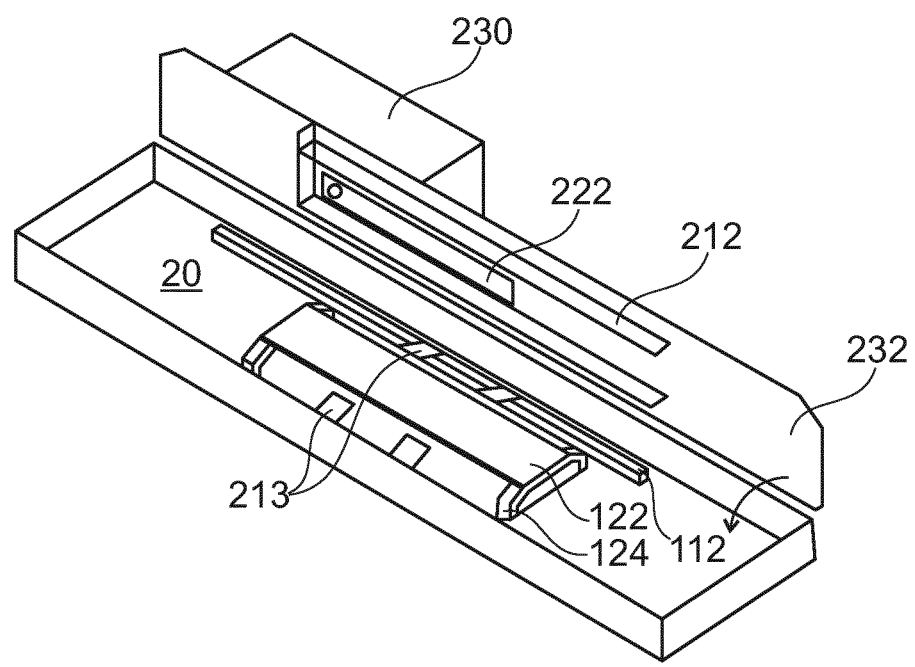
FIG. 2 shows a schematic perspective view from the rear side of the sputter deposition source including a defined RF return path and the matchbox according to embodiments described herein.
Figure 3A:
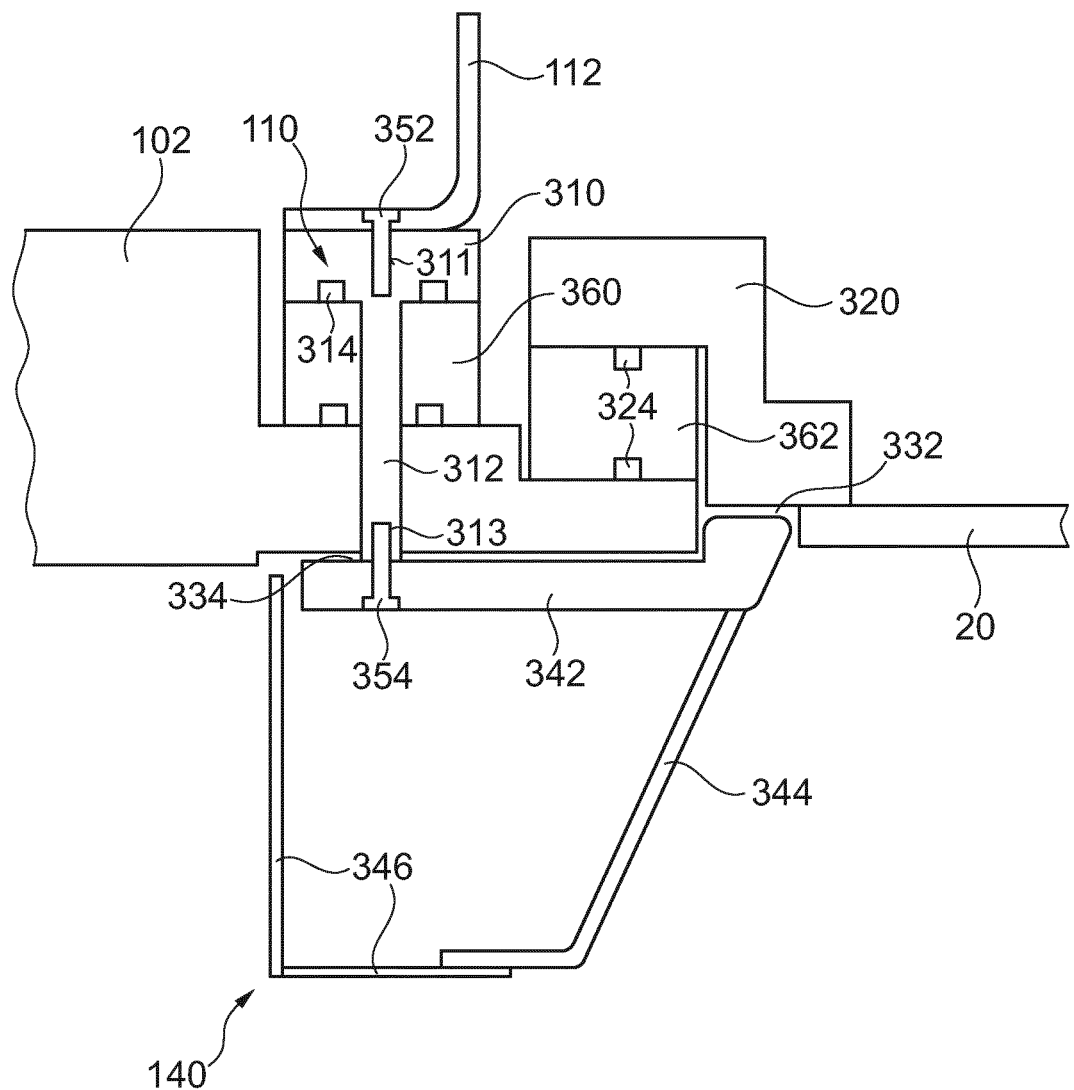
FIG. 3A shows a schematic enlarged view of FIG. 1.

FIG. 2 shows a schematic perspective view of a sputter deposition source for sputter deposition in the vacuum chamber and FIGS. 3A/B shows an enlarged cross-sectional view of a sputter deposition source. As shown in FIG. 2, a matchbox 230 is provided. The matchbox 230 can be connected to the matchbox door 232. The matchbox door 232 is shown in an open position in FIG. 2 and can be closed, e.g. as indicated by the arrow in FIG. 2. The matchbox 230 is connected to a hot path sheet-metal 222 and the power supply sheet-metal 212 for providing a defined return path for the RF currents. In FIG. 2, the backside of the target 20 is shown. Further the junction bridge 122 and the connectors 124 for providing the hot path to the target 20 are shown. The conductor rod 110 is provided and return path RF power collection sheet-metals 112 are connected to the conductor rods 110.

According to some embodiments, which can be combined with other embodiments described herein, one or more of the sheet-metal 112 can be screwed to an adjacent component in order to provide the proper conducting path for the RF currents. As exemplarily shown in FIGS. 3A and 3B, the return path RF power collection sheet-metal 112 is connected to the conductor rod 110 with screw 352. The conductor rod 110 extends through the wall portion 102 of the vacuum chamber from inside of the vacuum chamber (lower side in FIGS. 3A and 3B) to the outside of the vacuum chamber (upper side in FIGS. 3A and 3B). Accordingly, typical modifications of embodiments described herein include the conductor rod 110 having one or more threads 311 provided therein. Thereby, a sheet-metal or another component can be screwed to the conductor rod in order to provide a proper return path for the RF currents.

Figure 3B:
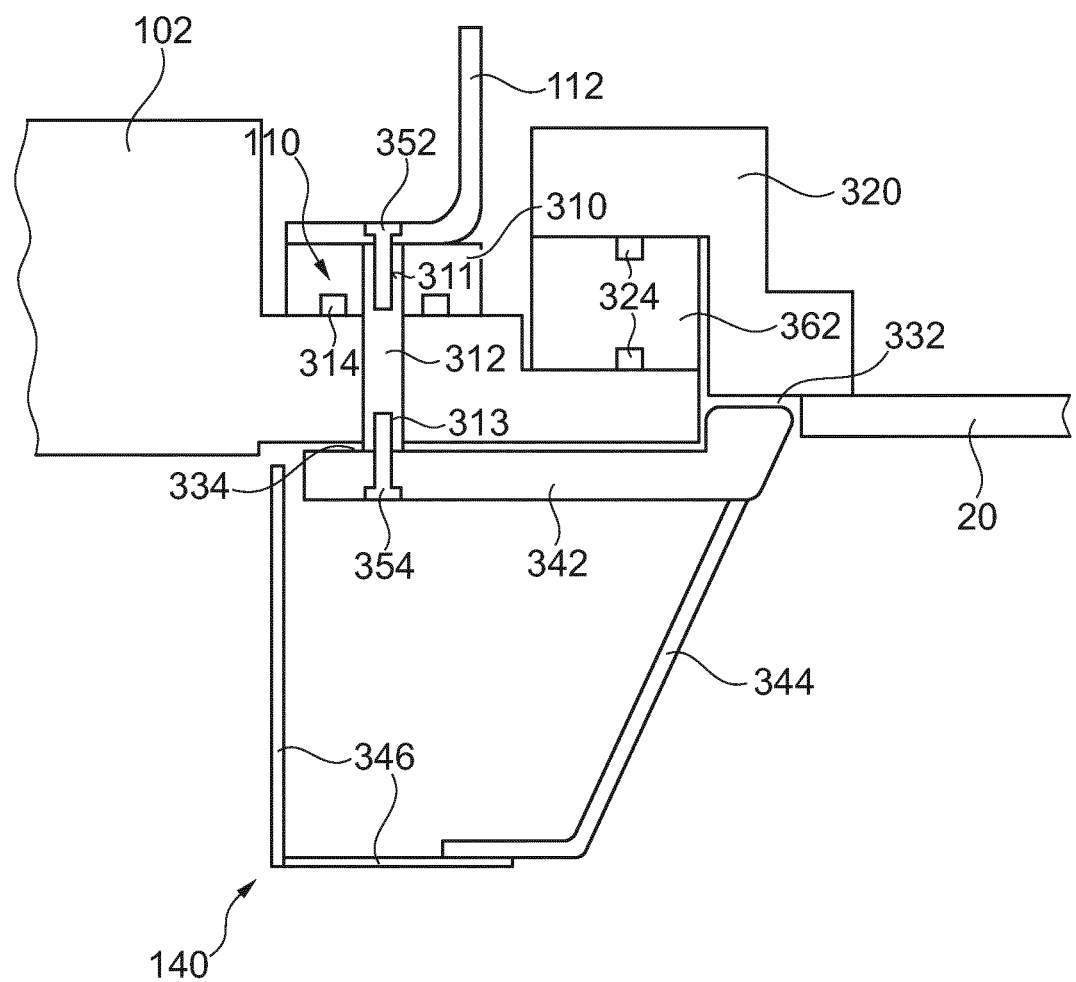
FIG. 3B shows an enlarged view similar to FIG. 3A, wherein further modifications of the defined return path are provided according to embodiments described herein.

According to typical embodiments, which can be combined with other embodiments described herein, the conductor rod 110 has the first portion 310, the upper portion in FIGS. 3A and 3B, and a second portion 312, the lower portion in FIGS. 3A and 3B. The first portion 310 is wider as compared to the second portions 312. Accordingly, the conductor rod 110 is configured to be inserted in an opening in the wall portion 102. The conductor rod 110 thereby extends from the inside of the vacuum chamber to the outside of the vacuum chamber. According to typical examples, the first portion 310 can include grooves 314 such that an O-ring can be inserted therein, in order to provide a vacuum seal for a technical vacuum.

According to typical embodiments, an insulator 360 can be provided between the conductor rod 110 and the wall portion 102. As shown in the example in FIG. 3A, also the insulator 360 can include grooves for receiving an O-ring. Alternatively, as shown in FIG. 3B, the conductor rod can be directly provided in the chamber wall. Thereby, a further electrical connection, i.e. return path of the vacuum chamber, i.e. the wall of the vacuum chamber is provided. Accordingly, a separate connection of the chamber wall to the return path might be of reduced relevance.

As an alternatively to the groove 314, the first portion 310 of the conductor rod 110 can have a surface with the roughness configured for providing a vacuum seal. The surface can be provided instead of the groove 314. In such an alternative, respective grooves can be provided at the upper end of the insulator 360 (see FIG. 2A) or the wall portion 102 (see FIG. 3B) and the connector rod 110 provides the sealing surface.

According to some embodiments, which can be combined with other embodiments described herein, also the second portion 312 of the conductor rod 110 can include a threat 313 or two or more threads 313 for receiving of screws 354. Thereby, components 140 provided in the vacuum chamber can be connected to the conductor rod 110 in order to provide a defined RF return path. For example, the component 140 can be shielding box having element 344, 342 and 346. The shielding box can further confine the plasma. The component 140, such as the shielding box and/or other components are connected to the conductor rod 110 in order to provide the RF return path. Typically, one or more of the elements selected from the group consisting of: a shielding box, a shield, a chamber wall portion, conduits for process gases, the vacuum chamber housing as such, and a transport or support system for a substrate can be connected to the conductor rod.

As shown in FIGS. 3A and 3B and according to embodiments, which can be combined with other embodiments described herein, the conductor rod 110 extends beyond the wall portion 102. Thereby, the gap 334 is provided. Yet further, the component 140 is mounted to the conductor rod 110 such that the darkroom area 332 is provided. The gap 334 and/or the dark room area 332 are provided to have a space to the wall portion 102 or an adjacent component of 0.5 mm or above. For example the gap 334 can be 0.8 mm to 1.5 mm and the darkroom area 332 can be 1.5 mm to 3 mm, e.g. about 2 mm. The dimension of the gap 334 and dark room area 332 allow for the surface current of the RF return path. Further, those gaps are dimensioned to reduce arcing or parasitic plasmas in these areas.

FIGS. 2 and 3 illustrate embodiments of a conductor rod 110. The conductor rod can also be denoted as "RF sword". In FIG. 2, the conductor rod 110 is below the return-path RF power collection sheet-metal 112, which extends along the surface of the target 20. As can be seen in the cross-sections shown in FIGS. 3A and 3B, the second portion 312 protrudes through the wall portion 102.

According to one embodiment, a conductor rod 110 can also extend along the surface, length or a dimension of the target. Additionally or alternatively, two or more short conductor rods can be provided. For an elongated conductor rod, according to one alternative, the second portion 312 can extend essentially along the entire length of the conductor rod 110. According to other embodiments, which can be combined with other embodiments described herein, the second portion 312 can be two or more poles or posts which are distributed along the length of the conductor rod 110.

According to yet further implementations, which can also be combined with other embodiments described herein, two or more conductor rods can be provided. Thereby, for example the length of one conductor rods can be reduced. For example each of the conductor rods could have a square shape or round shape and a plurality of conductor rods 110 are provided. Further, short conductor rods 110 can also be provided in addition to the conductor rods 110 extending along the length of the return-path RF power collection sheet-metal 112 as illustrated in FIG. 2, i.e. a conductor rod, which extends at least along 50% of a length of the target in one dimension.

The enlarged schematic views of FIGS. 3A and 3B further shows the support 324 of target 20. Typically, the support 320 is mounted to the wall portion 102 via an insulator 362. For example, the insulator 362 can have grooves 344 such that an O-ring can be inserted. Thereby, a vacuum seal can be provided such that the vacuum chamber of the sputter deposition apparatus can be evacuated to a technical vacuum.

Figure 4:
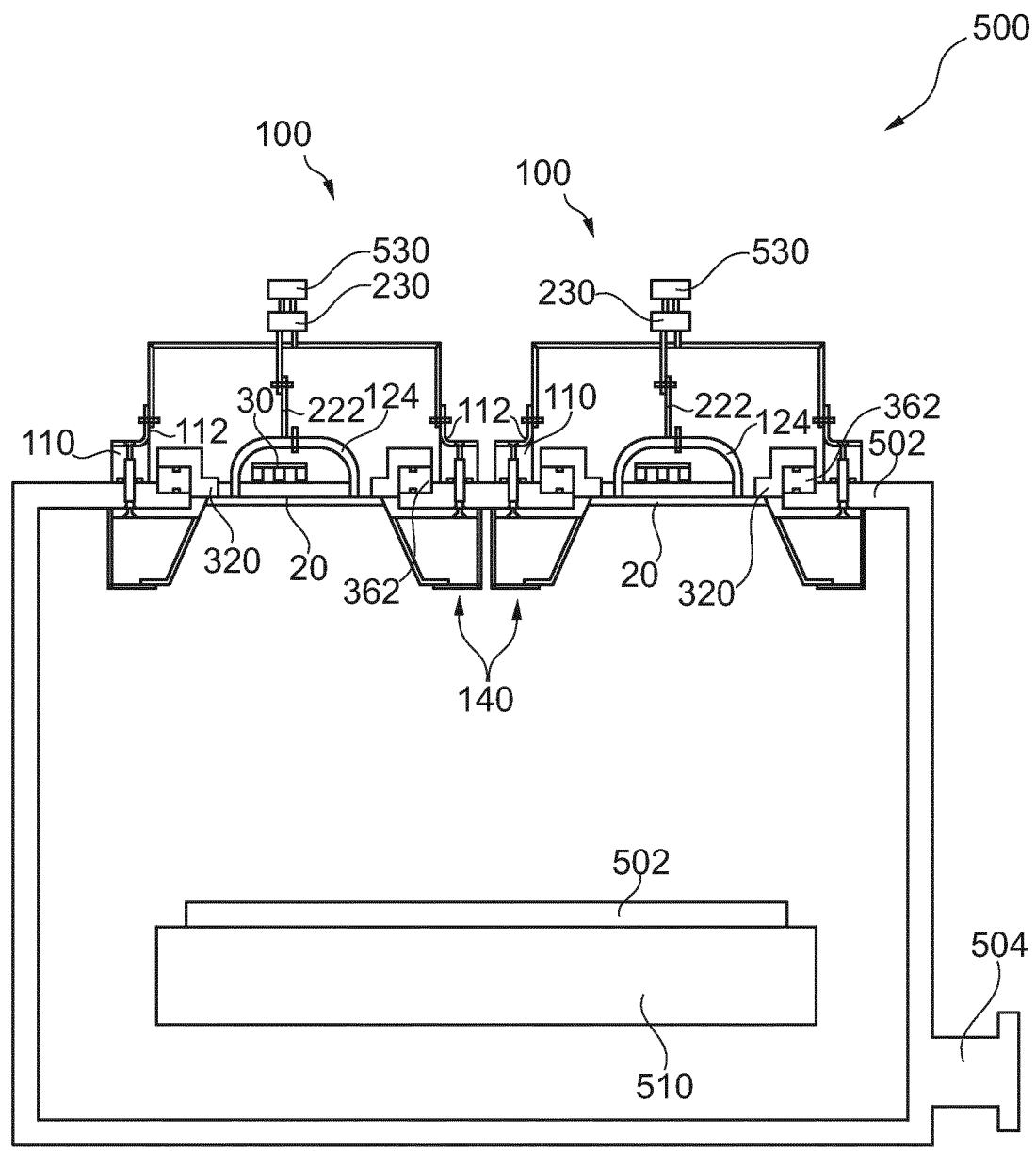
FIG. 4 shows a sputter deposition apparatus having a sputter deposition source including a defined RF return path according to embodiments described herein.

FIG. 4 shows an apparatus 500 for sputter deposition in a vacuum chamber 501. The vacuum chamber 501 can be evacuated through flange 504. Typically, further flanges 504 can be provided at other positions of the vacuum chamber. The substrate 502 to be coated with material from the target 20 is supported by the substrate support 510. The embodiment shown in FIG. 2 includes two sputter deposition sources. As shown in FIG. 4, the sputter deposition sources can be provided above the substrate 502 in order to sputter the material of the target 20 from the top downwards. Alternatively, the sputter deposition arrangement can be bottom-up. According to yet further embodiments, which can be combined with other embodiments described herein, the substrate 502 can also be arranged vertically in an apparatus for sputter deposition. Thereby, the substrate 502 can be supported by rollers or in a carrier, which is supported by rollers or another transportation and/or support system. Thereby, the substrate is oriented essentially vertically, i.e. with a deviation from the vertical arrangement of +−10°. Accordingly, in such vertical arrangement, the sputter deposition sources 100 are arranged at or adjacent a side wall of the apparatus 500.

As schematically shown in FIG. 4, each of the sputter deposition sources 100 includes a power supply 530, that is an RF power supply. The power supply 530 is connected to a matchbox 230. The matchbox 230 provides the RF power via various sheet-metals, for example the hot path sheet-metal 222 to the junction bridge, the connectors and the target 20, respectively. A defined RF return path is provided by conductor rods 110, which are connected to the return-path RF power collection sheet-metal 112. Further optional sheet-metals provide at return path to the matchbox 230 and, thus, the power supply 530.

Each sputter deposition source 100 shown in FIG. 4 is for sputter deposition in a vacuum chamber. The sputter deposition sources 100 include a target 20. As exemplarily shown in FIG. 4, sputter deposition sources can typically also include a magnetron. According to typical embodiments, which can be combined with other embodiments described herein, the magnetron 30 can be moved in at least one direction over the surface of the target 20.

The "hot" conductor of the RF power supply is connected to the target. In common RF sputter deposition sources the return-path of the RF power is provided by components of the vacuum chamber or components, e.g. holders, of the source, i.e. the return-path to the matchbox is undefined. According to embodiments described herein, a defined return path for RF currents is provided. As also shown in FIG. 4, the "hot" RF path for providing the RF power from the power supply, typically via the matchbox, is provided by the junction bridge and several connectors 124. Typically the connectors are connected to a backing plate of the target or a support for the target for providing RF power to the target 20. The matchbox power connector is provided by a hot path sheet-metal 222.

According to embodiments described herein, the defined return-path is provided by one or more conductor rods 110. According to yet further implementations, the conductor rods can be connected to a return-path RF power collection sheet-metal 112. According to yet further implementations, which can be combined with other embodiments described herein, the return-path RF power collection sheet-metal 112 can be provided to a power supply sheet-metal in order to provide at return path for the RF currents to the matchbox and/or the power supply.

Figure 5:
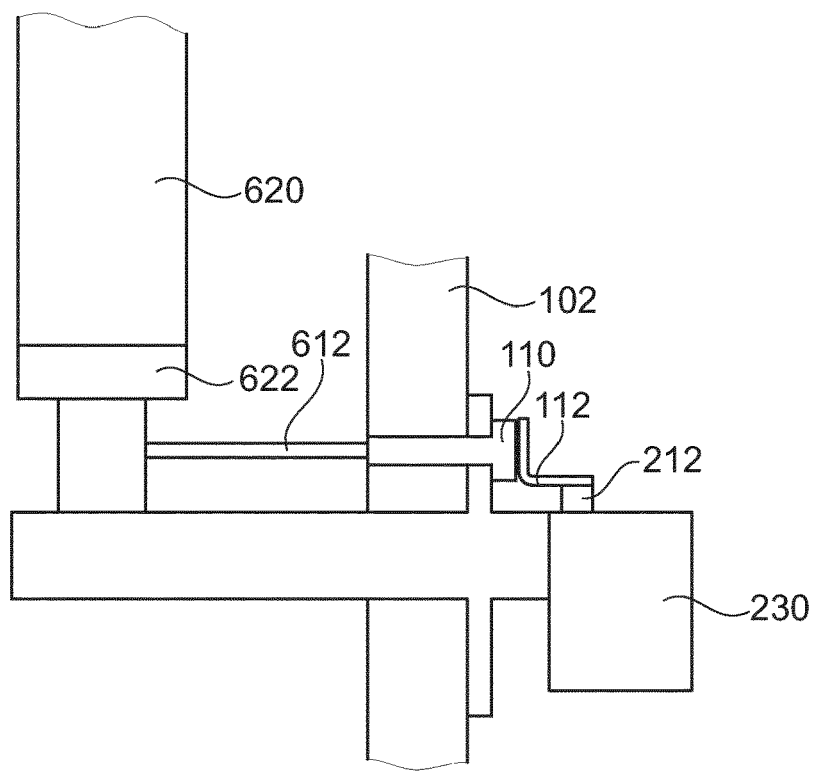
FIG. 5 shows yet another sputter deposition source including a defined RF return path according to embodiments described herein.

FIG. 5 illustrates a yet further example of the sputter deposition source. The sputter deposition source shown in FIG. 5 includes a rotatable target 620. The rotatable target 620 is supported by supports 602. Typically the support 602 can also include means for rotating the rotatable target 620. For example the means for rotating can include an actuator, a drive belt, a drivetrain, or motor configured for rotating the target. The support 602 typically also includes the connector for providing the power from the matchbox 230 to the target 620. In the embodiment shown in FIG. 5, the conductor rod 110 the collecting sheet 112 and the sheet-metals 612 and 212 are shown outside of the support 602. Yet, the return path for the RF currents, which is provided inter alia by the conductor rods extending through the wall portion 102 can also be integrated in the housing of the support 602.

Figure 6:
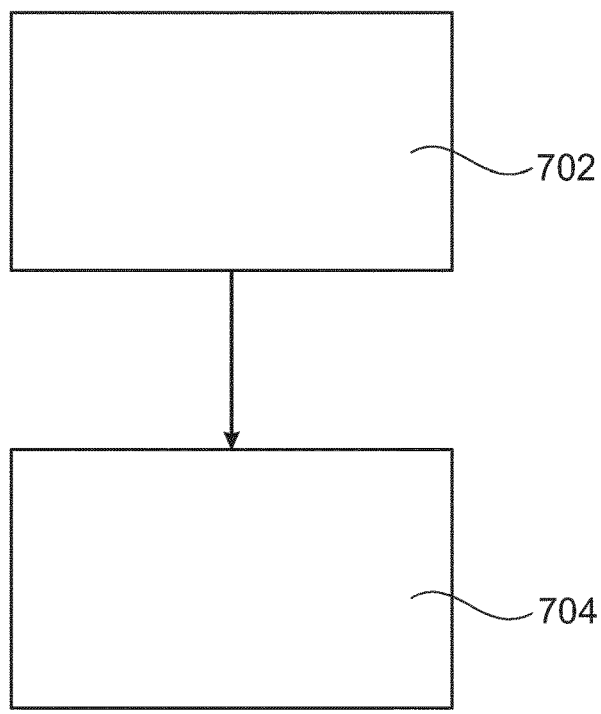
FIG. 6 shows the method of assembling and apparatus for sputter deposition.

FIG. 6 illustrates a method of assembling and apparatus for sputter deposition in the vacuum chamber. Thereby, in step 702 the conductor rod is inserted through a wall portion of the apparatus and/or a source for sputter deposition. In step 704 at least one component is connected to the conductor rods inside of the vacuum chamber and the conductor rods is connected to a matchbox and/or a power supply outside of the vacuum chamber.

In light of the above, applications utilizing RF sputtering or a combination of RF sputtering and another sputtering method, e.g. DC sputtering, pulse sputtering, or middle frequency sputtering can utilize the embodiments described herein. Thereby, arcing and parasitic plasmas can be reduced or even avoided by providing a defined return-path for the RF power, with which the target is sputtered.

According to one embodiment, a sputter deposition source for sputter deposition in a vacuum chamber is provided. The source includes a wall portion of the vacuum chamber; a target providing a material to be deposited during the sputter deposition; an RF power supply for providing RF power to the target; a power connector for connecting the target with the RF power supply; and a conductor rod extending through the wall portion from inside of the vacuum chamber to outside of the vacuum chamber, wherein the conductor rod is connected to one or more components inside of the vacuum chamber and wherein the conductor rod is connected to the RF power supply outside of the vacuum chamber to generate a defined RF return path through the conductor rod. The conductor rod provides a portion of the return-path, for example in combination with one or more sheet metals. According to typical modifications, which can be additionally or alternatively to each other provided, the conductor rod can have at least a thread at the outside of the vacuum chamber and/or at the inside of the vacuum chamber; and/or the conductor rod can be connected to a return path RF power collection sheet metal; the conductor rod can have a head portion having a width that is wider than the width of a further portion configured to protrude through the wall portion, particularly wherein the smallest width of the conductor rod is 5 mm or above, typically, 10 mm or above.

According to yet further embodiments, which can be combined with other embodiments described herein, the conductor rod can include at least one groove configured for an O-ring such that a vacuum seal is provided for the connection to the wall portion, e.g. at least one groove provided in the head portion; the RF power supply is connected to the power connector and the conductor rod via a matchbox; and/or the power connector further includes a junction bridge and a hot path sheet metal connected to the junction bridge, particularly screwed to the junction bridge. For example, the return path RF power collection sheet metal is connected to a power supply sheet-metal, and is particularly screwed to the power supply sheet-metal. According to yet further optional modifications, the conductor rod can protrude over an inside surface of the wall portion by at least 0.8 mm, typically by 1 mm to 3 mm such that a gap is formed between the inside surface of the wall portion and the one or more components.

According to another embodiment, an apparatus for sputter deposition in a vacuum chamber is provided. The apparatus includes a sputter deposition source according to any of the embodiments described herein and for sputter deposition in the vacuum chamber; and the vacuum chamber. For example, the wall portion can be a door of the source connected to the vacuum chamber.

According to yet another embodiment, a method of assembling an apparatus for sputter deposition in a vacuum chamber is provided. The method includes inserting a conductor rod through a wall portion of the apparatus; connecting at least one component inside of the vacuum chamber to the conductor rod; and connecting the conductor rod to the return path of an RF power supply. For example, the method further includes screwing a hot path sheet metal to a junction bridge being connected to a target; and wherein the connecting the conductor rod to the return path of an RF power supply comprises: screwing a power supply sheet metal to a return path RF power collection sheet metal.

While the foregoing is directed to embodiments of the invention, other and further embodiments of the invention may be devised without departing from the basic scope thereof, and the scope thereof is determined by the claims that follow.

The invention claimed is:

1. A sputter deposition source for sputter deposition in a vacuum chamber, comprising:
   a wall portion of the vacuum chamber;
   a target providing a material to be deposited during the sputter deposition;
   a support for the target disposed on the wall portion;
   an RF power supply for providing RF power to the target;
   a power connector for connecting the target with the RF power supply; and
   a conductor rod extending through the wall portion from inside of the vacuum chamber to outside of the vacuum chamber, wherein the conductor rod is connected to one or more components inside of the vacuum chamber, and wherein the conductor rod is connected to the RF power supply outside of the vacuum chamber to generate a defined RF return path through the conductor rod, and wherein the one or more components comprise at least a shielding box, wherein the shielding box, the wall portion, and the conduction rod form a gap comprising a darkroom area of the shielding box formed distal to the conduction rod, the darkroom area being sized and shaped to reduce the creation of at least one arcing and parasitic plasmas.

2. The sputter deposition source according to claim 1, wherein the conductor rod is connected to a return path RF power collection sheet metal.

3. The sputter deposition source according to claim 1, wherein the conductor rod has a head portion having a width that is wider than the width of a further portion configured to protrude through the wall portion.

4. The sputter deposition source according to claim 3, wherein the conductor rod includes at least one groove configured for an O-ring such that a vacuum seal is provided for the connection to the wall portion.

5. The sputter deposition source according to claim 4, wherein the conductor rod includes at least one groove provided in the head portion.

6. The sputter deposition source according to claim 1, wherein the RF power supply is connected to the power connector and the conductor rod via a matchbox.

7. The sputter deposition source according to claim 1, wherein the power connector further comprises:
   a junction bridge and a hot path sheet metal connected to the junction bridge.

8. The sputter deposition source according to claim 2, wherein the return path RF power collection sheet metal is connected to a power supply sheet metal.

9. The sputter deposition source according to claim 1, wherein the conductor rod protrudes over an inside surface of the wall portion by at least 0.8 mm such that a gap is formed between the inside surface of the wall portion and the one or more components.

10. An apparatus for sputter deposition in a vacuum chamber comprising:
    a sputter deposition source according to claim 1 and for sputter deposition in the vacuum chamber; and
    the vacuum chamber.

11. The apparatus according to claim 10, wherein the wall portion is a door of the source connected to the vacuum chamber.

12. A method of assembling an apparatus for sputter deposition in a vacuum chamber, comprising:
    inserting a conductor rod through a wall portion of the apparatus;
    providing a target for providing a material to be deposited during the sputter deposition, wherein a support for the target is disposed on the wall portion;
    connecting at least one component inside of the vacuum chamber to the conductor rod; and
    connecting the conductor rod to a RF power supply to generate a defined RF return path through the conductor rod,
    wherein the at least one component comprises at least a shielding box, wherein the shielding box, the wall portion, and the conduction rod form a gap comprising a darkroom area of the shielding box formed distal to the conduction rod, the darkroom area being sized and shaped to reduce the creation of at least one arcing and parasitic plasmas.

13. The method according to claim 12, wherein the method further comprises:
    screwing a hot path sheet metal to a junction bridge being connected to the target; and
    wherein the connecting the conductor rod to the return path of an RF power supply comprises:
    screwing a power supply sheet metal to a return path RF power collection sheet metal.

14. The sputter deposition source according to claim 3, wherein the smallest width of the conductor rod is 5 mm or above, or wherein the smallest width of the conductor rod is 10 mm or above.

15. The sputter deposition source according to claim 7, wherein the hot path sheet metal is screwed to the junction bridge.

16. The sputter deposition source according to claim 8, wherein the return path RF power collection sheet metal is screwed to the power supply sheet metal.

17. The sputter deposition source according to claim 9, wherein the conductor rod protrudes over the inside surface of the wall portion by 1 mm to 3 mm such that the gap is formed between the inside surface of the wall portion and the one or more components.

18. The sputter deposition source according to claim 1, wherein the conductor rod has at least a thread at least one of the outside of the vacuum chamber and the inside of the vacuum chamber.

* * * * *